(12) United States Patent
Yang

(10) Patent No.: US 11,881,269 B2
(45) Date of Patent: *Jan. 23, 2024

(54) METHOD FOR READING DATA STORED IN A FLASH MEMORY ACCORDING TO A VOLTAGE CHARACTERISTIC AND MEMORY CONTROLLER THEREOF

(71) Applicant: Silicon Motion, Inc., Jhubei (TW)

(72) Inventor: Tsung-Chieh Yang, Hsinchu (TW)

(73) Assignee: Silicon Motion, Inc., Jhubei (TW)

(*) Notice: Subject to any disclaimer, the term of this patent is extended or adjusted under 35 U.S.C. 154(b) by 424 days.

This patent is subject to a terminal disclaimer.

(21) Appl. No.: 17/302,422

(22) Filed: May 3, 2021

(65) Prior Publication Data

US 2021/0257030 A1 Aug. 19, 2021

Related U.S. Application Data

(63) Continuation of application No. 16/865,573, filed on May 4, 2020, now Pat. No. 11,031,087, which is a continuation of application No. 16/228,007, filed on Dec. 20, 2018, now Pat. No. 10,679,709, which is a continuation of application No. 15/852,847, filed on
(Continued)

(51) Int. Cl.
| | |
|---|---|
| *G11C 16/26* | (2006.01) |
| *G11C 16/06* | (2006.01) |
| *G11C 16/34* | (2006.01) |
| *G11C 16/04* | (2006.01) |
| *G11C 16/16* | (2006.01) |
| *G11C 16/10* | (2006.01) |

(52) U.S. Cl.
CPC .............. *G11C 16/26* (2013.01); *G11C 16/04* (2013.01); *G11C 16/0408* (2013.01); *G11C 16/06* (2013.01); *G11C 16/3418* (2013.01); *G11C 16/3431* (2013.01); *G11C 16/10* (2013.01); *G11C 16/16* (2013.01)

(58) Field of Classification Search
CPC ..... G11C 16/26; G11C 16/04; G11C 16/0408; G11C 16/06; G11C 16/3431; G11C 16/10; G11C 16/16
USPC ............... 365/185.09, 185.08, 185.29, 185.3
See application file for complete search history.

(56) References Cited

U.S. PATENT DOCUMENTS

| 2008/0013380 A1 | 1/2008 | Cornwell et al. |
| 2008/0175055 A1 | 7/2008 | Kim |
(Continued)

FOREIGN PATENT DOCUMENTS

CN 101968970 A 2/2011

*Primary Examiner* — Connie C Yoha
(74) *Attorney, Agent, or Firm* — Wang Law Firm, Inc.

(57) ABSTRACT

A method for reading data stored in a flash memory. The flash memory comprises a plurality of memory cells and each memory cell has a particular threshold voltage. The method includes: obtaining a first threshold voltage distribution representing threshold voltages of a first group of the memory cells; obtaining a second threshold voltage distribution representing threshold voltages of a second group of the memory cells, wherein the second threshold voltage distribution is different from the first threshold voltage distribution, and the first group of the memory cells comprises at least a part of the second group of the memory cells; and controlling the flash memory to perform at least one read operation upon the first group of the memory cells according to the second threshold voltage distribution.

8 Claims, 9 Drawing Sheets

Related U.S. Application Data

Dec. 22, 2017, now Pat. No. 10,199,110, which is a continuation of application No. 15/337,485, filed on Oct. 28, 2016, now abandoned, which is a continuation of application No. 14/812,434, filed on Jul. 29, 2015, now Pat. No. 9,508,436, which is a continuation of application No. 14/171,207, filed on Feb. 3, 2014, now Pat. No. 9,293,203, which is a continuation of application No. 13/402,550, filed on Feb. 22, 2012, now Pat. No. 8,681,569.

(56) References Cited

U.S. PATENT DOCUMENTS

| | | | |
|---|---|---|---|
| 2012/0140560 A1* | 6/2012 | Yang | G06F 3/0659 365/185.18 |
| 2013/0215678 A1* | 8/2013 | Yang | G06F 11/1048 365/185.03 |

* cited by examiner

METHOD FOR READING DATA STORED IN A FLASH MEMORY ACCORDING TO A VOLTAGE CHARACTERISTIC AND MEMORY CONTROLLER THEREOF

CROSS-REFERENCE TO RELATED APPLICATION

This application is a continuation of U.S. Ser. No. 16/865,573, filed on May 4, 2020, which is a continuation of U.S. Ser. No. 16/228,007, filed on Dec. 20, 2018, which is a continuation of U.S. Ser. No. 15/852,847, filed on Dec. 22, 2017, which is a continuation of U.S. Ser. No. 15/337,485, filed on Oct. 28, 2016, which is a continuation of U.S. Ser. No. 14/812,434, filed on Jul. 29, 2015, which is a continuation of U.S. Ser. No. 14/171,207, filed on Feb. 3, 2014, which is a continuation of U.S. Ser. No. 13/402,500, filed on Feb. 22, 2012, the specifications of which are incorporated herein by reference.

BACKGROUND OF THE INVENTION

1. Field of the Invention

The disclosed embodiments of the present invention relate to reading data stored in a flash memory, and more particularly, to a method and memory controller for reading data stored in a flash memory by referring to binary digit distribution characteristics of bit sequences read from memory cells of the flash memory.

2. Description of the Prior Art

Flash memory can be electrically erased and programmed for data storage. It is widely used in memory cards, solid-state drives, portable multimedia players, etc. As the flash memory is a non-volatile memory, no power is needed to maintain the information stored in the flash memory. Besides, the flash memory offers fast read access and better shock resistance. These characteristics explain the popularity of the flash memory.

The flash memories may be categorized into NOR-type flash memories and NAND-type flash memories. Regarding the NAND flash memory, it has reduced erasing and programming time and requires less chip area per cell, thus allowing greater storage density and lower cost per bit than the NOR flash memory. In general, the flash memory stores data in an array of memory cells made from floating-gate transistors. Each memory cell can store one bit of information or more than one bit of information by adequately controlling the number of electrical charge on its floating gate to configure the threshold voltage required for turning on the memory cell made of a floating-gate transistor. In this way, when one or more predetermined control gate voltages are applied to a control gate of the floating-gate transistor, the conductive status of the floating-gate transistor would indicate the binary digit(s) stored by the floating-gate transistor.

However, due to certain factors, the number of electrical charge originally stored on one flash memory cell may be affected/disturbed. For example, the interference presented in the flash memory may be originated from write (program) disturbance, read disturbance, and/or retention disturbance. Taking a NAND flash memory including memory cells each storing more than one bit of information for example, one physical page includes multiple logical pages, and each of the logical pages is read by using one or more control gate voltages. For instance, regarding one flash memory cell which is configured to store three bits of information, the flash memory cell may have one of eight possible states (i.e., electrical charge levels) corresponding to different electrical charge amounts (i.e., different threshold voltages), respectively. However, due to the increase of the program/erase (P/E) count and/or the retention time, the threshold voltage distribution of memory cells in the flash memory may be changed. Thus, using original control gate voltage setting (i.e., threshold voltage setting) to read the stored bits from the memory cell may fail to obtain the correct stored information due to the changed threshold voltage distribution.

SUMMARY OF THE INVENTION

In accordance with exemplary embodiments of the present invention, a method, memory controller, and system for reading data stored in a flash memory by referring to threshold voltage distribution are proposed to solve the above-mentioned problem.

According to an aspect of the present invention, an exemplary method for reading data stored in a flash memory is disclosed. The flash memory comprises a plurality of memory cells and each memory cell has a particular threshold voltage The exemplary method includes: obtaining a first threshold voltage distribution representing threshold voltages of a first group of the memory cells; obtaining a second threshold voltage distribution representing threshold voltages of a second group of the memory cells, wherein the second threshold voltage distribution is different from the first threshold voltage distribution, and the first group of the memory cells comprises at least a part of the second group of the memory cells; and controlling the flash memory to perform at least one read operation upon the first group of the memory cells according to the second threshold voltage distribution.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The generalized conception of the present invention is to read data stored in a flash memory. The flash memory comprises a plurality of memory cells, and each memory cell has a particular threshold voltage. The data is read by obtaining a first threshold voltage distribution representing threshold voltages of a first group of the memory cells, obtaining a second threshold voltage distribution representing threshold voltages of a second group of the memory cells, wherein the second threshold voltage distribution is different from the first threshold voltage distribution and the first group of the memory cells comprises at least a part of the second group of the memory cells, and controlling the flash memory to perform at least one read operation upon the first group of the memory cells according to the second threshold voltage distribution. Thereby, a better threshold voltage can be utilized during the read operation, and the bit error rate can be reduced. Further details are described as follows.

Please note that the threshold voltage distribution illustrated in the accompanying figures and values of the control gate voltages mentioned hereinafter are for illustrative purposes only, and are not meant to be limitations of the present invention. Besides, for simplicity and clarity, reading multiple bits stored by memory cells of one physical page in a NAND-type flash memory is taken as an example for illustrating technical features of the present invention. However, no matter whether the flash memory is a NAND-type flash memory or a flash memory of other type (e.g., a NOR-type flash memory), the spirit of the present invention is obeyed as long as the read operation can be performed according to a smoother threshold voltage distribution.

Figure 1:
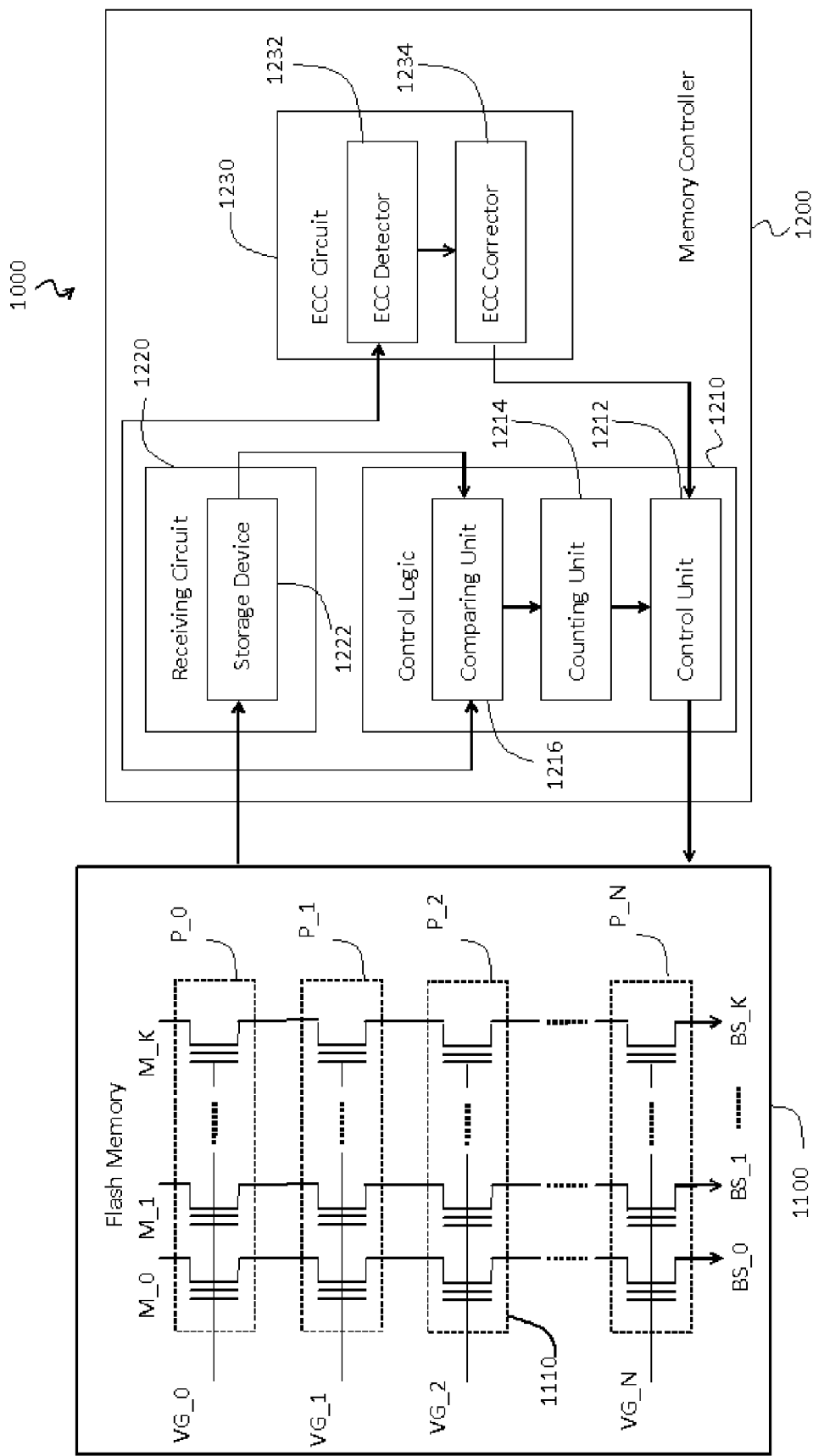
FIG. 1 is a diagram illustrating a memory system according to an exemplary embodiment of the present invention.

Please refer to FIG. 1, which is a diagram illustrating a memory system according to an exemplary embodiment of the present invention. The exemplary memory system 1000 includes a memory controller 1200 and the aforementioned flash memory (e.g., a NAMD-type flash memory) 1100. To read the data stored in the memory cells M_0-M_K of the target physical page P_0, the control gate voltages VG_0-VG_N should be properly set. For example, the control gate voltages VG_1-VG_N should be properly set to ensure that all of the memory cells (floating-gate transistors) 103 of the physical pages P_1-P_N are conductive. In a case where each of the memory cell 103 is configured to store N bits (e.g., three bits including a least significant bit (LSB), a central significant bit (CSB), and a most significant bit (MSB)), the flash memory 102 sets the control gate voltage VG_0 to ($2^N-1$) voltage levels for identifying all of the N bits of each memory cell 103 of the target physical page P_0. Each of the memory cells 1110 in this exemplary embodiment is configured to store 3 bits, including a least significant bit (LSB), a central significant bit (CSB), and a most significant bit (MSB). Thus, the memory controller 1200 determines eight control gate voltages $V_{LSB}$, $V_{CSB1}$, $V_{CSB2}$, $V_{MSB1}$, $V_{MSB2}$, $V_{MSB3}$, and $V_{MSB4}$, and controls the flash memory 1100 to perform read operations according to these configured control gate voltages. In the following exemplary embodiments, read operations are performed upon the LSB of the memory cells. However, this is for illustration purpose only rather than a limitation.

The memory controller 1200 is implemented to control access (read/write) of the flash memory 1100. In this exemplary embodiment, the memory controller 1200 includes, but is not limited to, a control logic 1210 having a control unit 1212, a counting unit 1214, and a comparing unit 1216 included therein, a receiving circuit 1220 having a storage device (e.g., a memory device) 1222, and an ECC circuit 1230 having an ECC detector 1222 and an ECC corrector 1224 included therein. Please note that only the elements pertinent to the technical features of the present invention are shown in FIG. 1 for clarity and simplicity. That is, the memory controller 1200 may include additional elements to support other functionality. As mentioned above, the threshold voltage distribution of memory cells 1110 included in the flash memory 1100 may be changed due to certain factors such as read disturbance, write/program disturbance, and/or retention disturbance. As known to those skilled in the art, part of the memory cells 1110 of one physical page is utilized for storing ECC information (e.g., an ECC code). Thus, the ECC circuit 1230 is operative to perform an ECC operation upon the readout information (e.g., a codeword) read from one physical page. More specifically, the ECC detector 1222 checks the correctness of the readout information, thereby detecting the existence of error bits presented in the checked readout information. When notified by the ECC detector 1222, the ECC corrector 1224 is operative for correcting the error bits found in the checked readout information. However, when the number of error bits existing in the readout information exceeds a maximum number of error bits that can be corrected by the ECC corrector 1224, the ECC corrector 1224 indicates that the readout information includes uncorrectable error bits. Thus, the control logic 1210 enables the threshold voltage tracking mechanism to determine the readout information which can pass the ECC parity check performed by the ECC circuit 1230. Detailed are described as below.

In this exemplary embodiment, the ECC circuit 1230 may be a Bose-Chaudhuri-Hocquenghem (BCH) decoder. The control logic 1210 is arranged for controlling the flash memory 1100 to perform a plurality of read operations upon each of the memory cells M_0-M_K of the target physical page P_0, and determining readout information of the memory cells M_0-M_K according to binary digit distribution characteristics of bit sequences BS_0-BS_K. The read operations include at least a first read operation, a second read operation, and a third read operation used for determining control gate voltage shifting direction(s) used for finding better control gate voltage(s). Further details are described as below.

Figure 2:
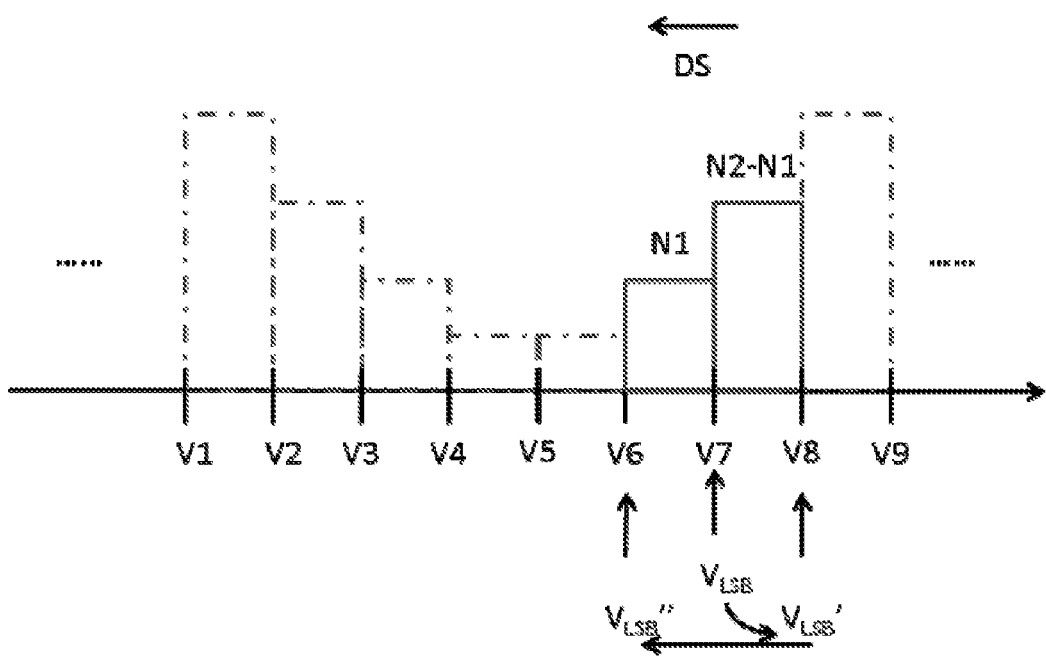
FIG. 2 is a diagram illustrating the adjustment made to the control gate voltage used for reading LSB data according to an embodiment of the present invention.
Figure 3:
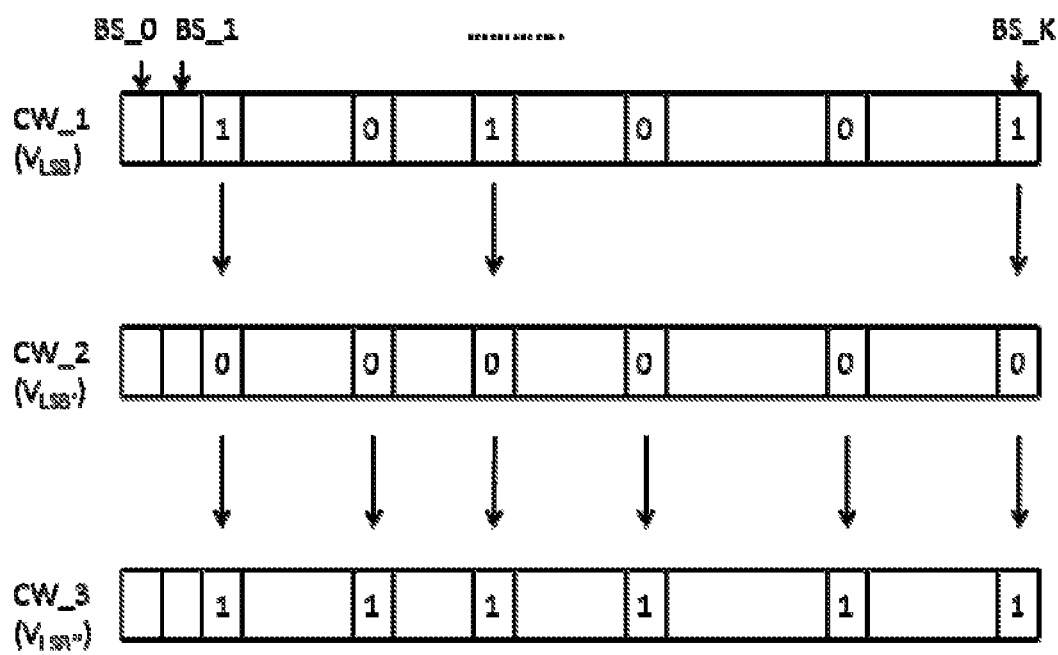
FIG. 3 is a diagram illustrating the operation of determining a shifting direction of the control gate voltage for finding a better control gate voltage used for reading LSB data according to an embodiment of the present invention.

Please refer to FIG. 2 in conjunction with FIG. 3. FIG. 2 is a diagram illustrating the adjustment made to the control gate voltage used for reading LSB data according to an embodiment of the present invention. FIG. 3 is a diagram illustrating the operation of determining a shifting direction of the control gate voltage for finding a better control gate voltage used for reading LSB data according to an embodiment of the present invention. Due to change of the threshold voltage distribution, the threshold voltages of some memory cells each originally programmed to store LSB=1 are distributed in the voltage region V5-V9, and the threshold voltages of some memory cells each originally programmed to have the electrical charge level L4 to store LSB=0 are distributed in the voltage region V1-V5. To have a minimum number of error bits presented in the readout information of the target physical page P_0, the control gate voltage for reading LSB data should be preferably set by V5 shown in FIG. 2. When the initial control gate voltage $V_{LSB}$ is set to V7 by the control unit 1212 and the flash memory 1100 performs the first read operation upon memory cells M_0-M_K according to the initial control gate voltage $V_{LSB}$, the number of error bits presented in the readout information (i.e., a first codeword CW_1 consisted of first bits of the bit sequences BS_0-BS_K) exceeds the maximum number of error bits that can be corrected by the ECC circuit 1230. Thus, the threshold voltage tracking mechanism is enabled accordingly. Next, the control unit 1212 updates the initial control gate voltage $V_{LSB}$ employed by the first read operation by V6 which is lower than V7 with a minimum step size ($\Delta V$) that the memory controller 1200 can control the flash memory 1100 to adjust. Then the control unit 1212 controls the flash memory to perform the second read operation upon memory cells M_0-M_K according to the updated control gate voltage $V_{LSB}'$. Thus, a second codeword CW_2 consisted of second bits of the bit sequences BS_0-BS_K is received by the receiving circuit 1220. Please note that the first codeword CW_1 is buffered in the storage device 1222, and bits of the first codeword CW_1 buffered in the storage device 1222 are transmitted to the comparing unit 1216 one by one before overwritten by the incoming bits of the second codeword CW_2. The comparing unit 1216 is arranged for comparing bits of the first codeword CW_1 (i.e., first bits of the bit sequences BS_0-BS_K) and bits of the second codeword CW_2 (i.e., second bits of the bit sequences BS_0-BS_K). The comparison result will indicate which bit position has one first bit flipping due to a transition from a first binary digit (e.g., "1") to a second binary digit (e.g., "0"). The counting unit 1214 is coupled to the comparing unit 1216 and the control unit 1212, and is arranged for counting the number of first bit flipping between the first codeword CW_1 and the second codeword CW_2. That is, the counting unit 1214 generates a first counter number N1 by counting the number of first bit flipping between first bits and second bits of the bit sequences BS_0-BS_K, wherein one first bit flipping occurs when the first bit and the second bit of one bit sequence have the first binary digit (e.g., "1") and the second binary digit (e.g., "0"), respectively.

Next, the control unit 1212 updates the current control gate voltage $V_{LSB}'$ employed by the second read operation by V8 which is higher than V7, and then controls the flash memory to perform the third read operation upon memory cells M_0-M_K according to the updated control gate voltage $V_{LSB}''$. Thus, a third codeword CW_3 consisted of third bits of the bit sequences BS_0-BS_K is received by the receiving circuit 1220. Please note that the first codeword CW_1 originally buffered in the storage device 1222 will be overwritten by the second codeword CW_2; additionally, bits of the second codeword CW_2 buffered in the storage device 1222 are transmitted to the comparing unit 1216 one by one before overwritten by the incoming bits of the third codeword CW_3. The comparing unit 1216 is further arranged for comparing bits of the second codeword CW_2 (i.e., second bits of the bit sequences BS_0-BS_K) and bits of the third codeword CW_3 (i.e., third bits of the bit sequences BS_0-BS_K). The comparison result will indicate which bit position has the second bit flipping due to a transition from the second binary digit (e.g., "0") to the first binary digit (e.g., "1"). The counting unit 1214 is further arranged for counting the number of second bit flipping between the second codeword CW_2 and the third codeword CW_3. That is, the counting unit 1214 generates a second counter number N2 by counting the number of second bit flipping between second bits and third bits of the bit sequences BS_0-BS_K, wherein one second bit flipping occurs when the second bit and the third bit of one bit sequence have the second binary digit (e.g., "0") and the first binary digit (e.g., "1"), respectively.

After receiving the first counter number N1 and the second counter number N2 generated from the counting unit 1214, the control unit 1212 determines the readout information which can pass the ECC parity check by referring to the first counter number N1 and the second counter number N2. For example, the control unit 1212 determines the shifting direction DS of the control gate voltage according to the first counter number N1 and the second counter number N2. More specifically, as can be seen from FIG. 2, the first counter number N1 represents the total number of 0's newly identified due to shifting the control gate voltage from V7-V6, and the second counter number N2 represents the total number of 1's newly identified due to shifting the control gate voltage from V6-V8. Thus, the number (N2−N1) is representative of a total number of 1's resulted from shifting the control gate voltage from V7-V8. In this exemplary embodiment, (N2−N1) is greater than N1, implying that the local minimum of the threshold voltage distribution corresponding to the logical "1" and "0" is located on a left side of the initial control gate voltage $V_{LSB}$. Based on such an observation, the control unit 1212 decides the shifting direction DS accordingly. In addition, the first counter number N1 represents the number of memory cells whose threshold voltage is located between V7 and V6. The number (N2−N1) represents the number of memory cells whose threshold voltage is located between V7 and V8. The first counter number N1 and number (N2−N1) represent the threshold voltage distribution of a part of the memory cells M_0-M_K.

After the shifting direction DS is determined, the control logic 1212 determines a new control gate voltage according to the shifting direction DS. When the readout information (i.e., a new codeword) obtained from applying the new control gate voltage to the control gate of each of the memory cells M_0-M_K of the target physical page P_0 passes the ECC parity check, this implies that the codeword processed by the ECC circuit 1230 will become error-free. As the LSB data is successfully determined by the control unit 1212 which updates the control gate voltage according to the shifting direction DS, the control unit 1212 records the currently used control gate voltage as an initial control gate voltage to be used by the next LSB read operation performed upon the physical page P_0.

However, when the readout information (i.e., a new codeword) obtained from applying the new control gate voltage to the control gate of each of the memory cells M_0-M_K of the physical page P_0 fails to pass the ECC parity check, this implies that the codeword processed by the ECC circuit 1230 still contains uncorrectable error bits, the control logic 912 will determine another control gate voltage according to the shifting direction DS. Updating the control gate voltage according to the shifting direction DS is not stopped until the codeword is error-free or all of the error bits presented in the codeword are correctable. Please note that the ECC circuit (e.g., a BCH decoder) 1230 has error correction capability. Therefore, the control unit 1212 is not required to exactly shift the control gate voltage to the optimum value V5 according to the shifting direction DS.

In above exemplary embodiment, the control unit 1212 controls the flash memory 1100 to perform the first read operation which utilizes the initial control gate voltage $V_{LSB}$, the second read operation which utilizes the lower control gate voltage $V_{LSB}'$, and the third read operation which utilizes the higher control gate voltage $V_{LSB}''$, sequentially. Therefore, the initial control gate voltage $V_{LSB}$, the lower control gate voltage $V_{LSB}'$ and the higher control gate voltage $V_{LSB}''$ are applied to the control gate of each of the memory cells M_0-M_K, sequentially. However, this is for illustrative purposes only, and is not meant to be a limitation of the present invention.

Figure 4:
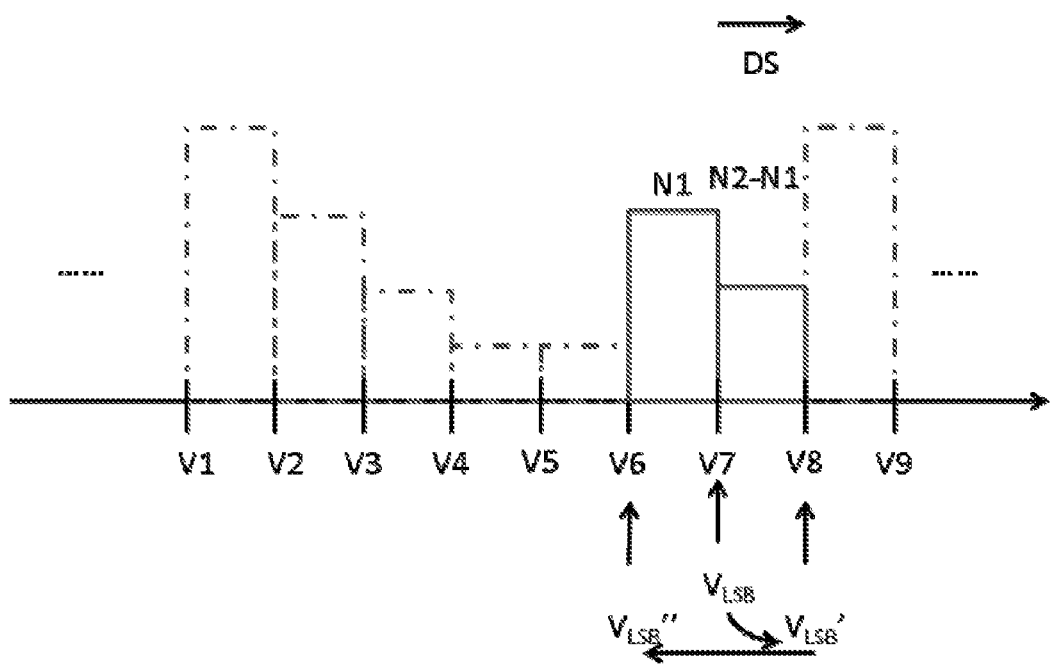
FIG. 4 is a diagram illustrating the adjustment made to the control gate voltage used for reading LSB data according to another embodiment of the present invention.

As mentioned above, the threshold voltage distribution of memory cells 1110 included in the flash memory 1100 may be changed due to certain factors such as read disturbance, write/program disturbance, and/or retention disturbance. In some situations, the threshold voltage distribution of the memory cells may be changed to a non-uniform distribution. FIG. 4 is a diagram illustrating the adjustment made to the control gate voltage used for reading LSB data according to another embodiment of the present invention. As shown in FIG. 4, the threshold voltage distribution of memory cells M_0-M_K of the physical page P_1 is not uniform. The optimal control gate voltage for reading the memory cells might be V5. In other words, the control gate voltage V5 can be deemed as a global minimum of the threshold voltage distribution of memory cells. Due to the non-uniform distribution between voltages V6-V8, however, the optimal control gate voltage V5 may not be found. Please note that each voltage difference of control gate voltages V1-V9 is the minimum step size (ΔV) that the memory controller 1200 can control the flash memory 1100 to adjust. According to concepts of the threshold voltage tracking mechanism mentioned above, a first counter number N1, a second counter number N2, and the number (N2−N1) of the memory cells of the physical page P_1 can be found, respectively. The first counter number N1 represents the number of the memory cells of the physical page P_1 whose threshold voltages are located between V6-V7. The number (N2−N1) represents the number of the memory cells of the physical page P_1 whose threshold voltages are located between V7-V8. The first count number N1 and number (N2−N1) represent a threshold voltage distribution of the memory cells of the physical page P_1 whose threshold voltages are located between V6-V8. Beside, according to concepts of the threshold voltage tracking mechanism mentioned above, the shifting direction DS can be wrongly determined as the right direction, i.e. toward to a voltage higher than the initial control gate voltage $V_{LSB}$. Hence, updating the control gate voltage according to the shifting direction DS is not helpful for obtaining an error-free codeword or a correctable codeword. Since a correctable codeword can not be obtained, the control unit 1212 adjusts the control gate voltage to voltages (e.g. V8, V9, etc.) higher than the initial voltage $V_{LSB}$ and obtains the corresponding readout information again and again. After several times (e.g. 3 times) of ECC fail (uncorrectable), the control unit 1222 stops to adjust the control gate voltage according to the shifting direction DS (adjust to voltages, e.g. V8, V9, etc., higher than the initial voltage $V_{LSB}$) and enters a further stage of the threshold voltage tracking mechanism. Further details are described as below.

Figure 5:
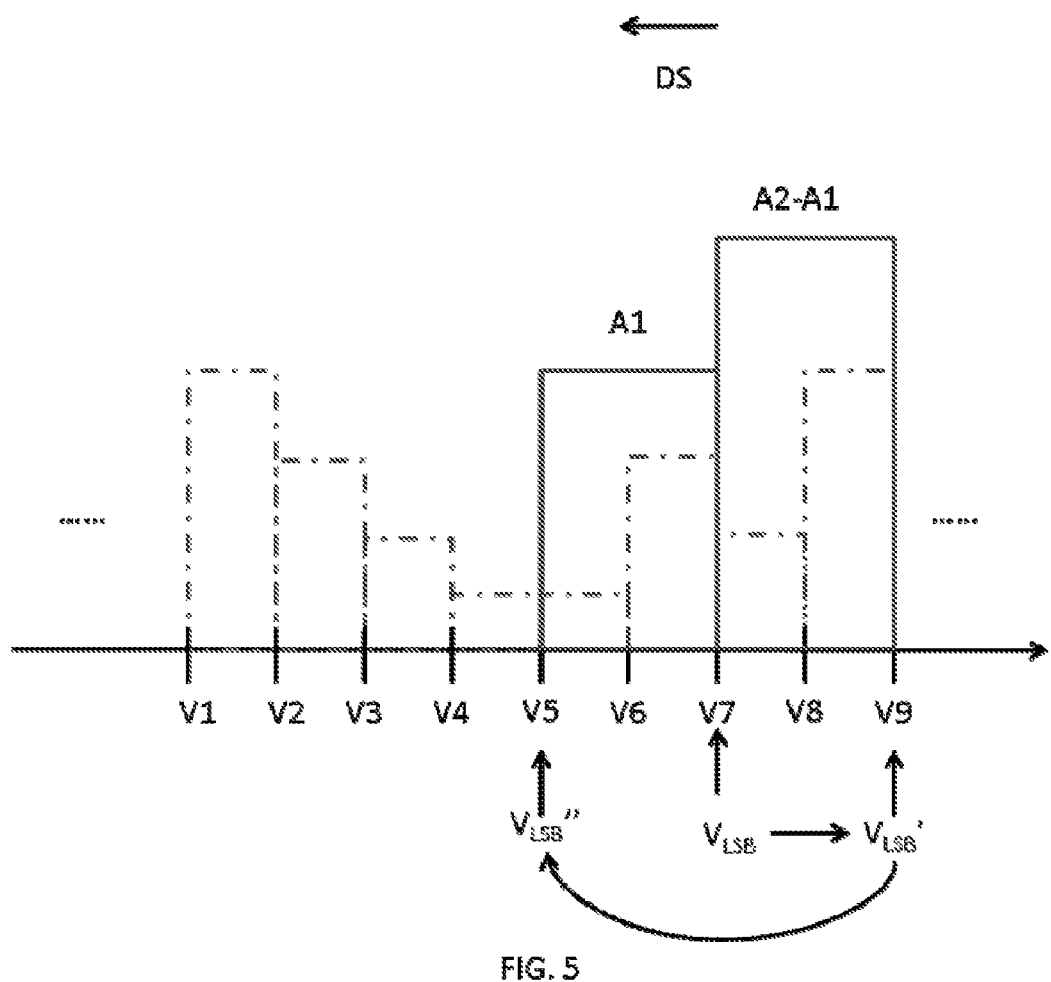
FIG. 5 is a diagram illustrating the adjustment made to the control gate voltage used for reading LSB data of the target physical page P_1 according to an embodiment of the present invention.
Figure 6:
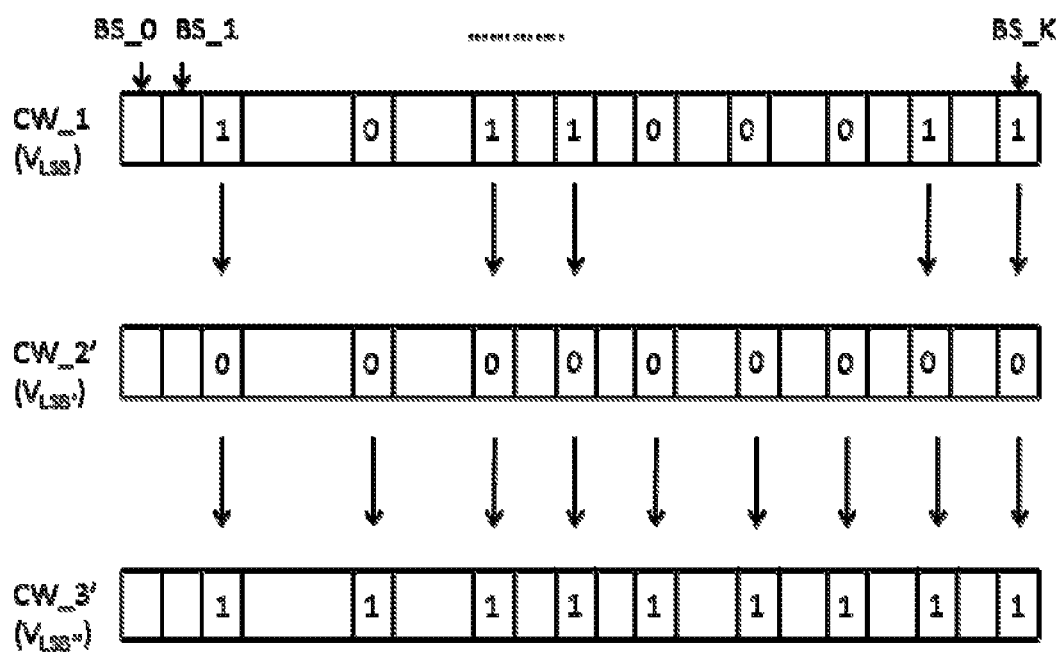
FIG. 6 is a diagram illustrating the operation of determining a shifting direction of the control gate voltage for finding a better control gate voltage used for reading LSB data the target physical page P_1 according to an embodiment of the present invention.

Please refer to FIG. 5 in conjunction with FIG. 6. FIG. 5 is a diagram illustrating the adjustment made to the control gate voltage used for reading LSB data of the target physical page P_1 according to an embodiment of the present invention. FIG. 6 is a diagram illustrating the operation of determining a shifting direction of the control gate voltage for finding a better control gate voltage used for reading LSB data the target physical page P_1 according to an embodiment of the present invention. To have a minimum number of error bits presented in the readout information of the target physical page P_1, the control gate voltage for reading LSB data should be preferably set. Since the shifting direction DS found in the last time is not helpful for finding a correctable codeword. The control unit 1212 will increase the step size of the control gate voltage adjustment in the further stage of the threshold voltage tracking mechanism for eliminating the non-uniform effect of threshold voltage distribution. The initial control gate voltage $V_{LSB}$ is set to V7 by the control unit 1212, and the flash memory 1100 performs the first read operation upon memory cells M_0-M_K of the physical page P_1 according to the initial control gate voltage $V_{LSB}$ and obtains a first codeword CW_1' consisted of first bits of the bit sequences BS_0-BS_K. Next, the control unit 1212 updates the initial control gate voltage $V_{LSB}$ employed by the first read operation by V5 which is lower than V7 with 2 minimum step size ΔV, i.e. 2ΔV. The control unit 1212 controls the flash memory 1100 to perform the second read operation upon memory cells M_0-M_K according to the updated control gate voltage $V_{LSB}'$. Thus, a second codeword CW_2' consisted of second bits of the bit sequences BS_0-BS_K is received by the receiving circuit 1220. Please note that the first codeword CW_1' is buffered in the storage device 1222, and bits of the first codeword CW_1' buffered in the storage device 1222 are transmitted to the comparing unit 1216 one by one before overwritten by the incoming bits of the second codeword CW_2'. The comparing unit 1216 is arranged for comparing bits of the first codeword CW_1' (i.e., first bits of the bit sequences BS_0-BS_K) and bits of the second codeword CW_2' (i.e., second bits of the bit sequences BS_0-BS_K). The comparison result will indicate which bit position has one first bit flipping due to a transition from a first binary digit (e.g., "1") to a second binary digit (e.g., "0"). The counting unit 1214 is coupled to the comparing unit 1216 and the control unit 1212, and is arranged for counting the number of first bit flipping between the first codeword CW_1' and the second codeword CW_2'. That is, the counting unit 1214 generates a first counter number A1 by counting the number of first bit flipping between first bits and second bits of the bit sequences BS_0-BS_K, wherein one first bit flipping occurs when the first bit and the second bit of one bit sequence have the first binary digit (e.g., "1") and the second binary digit (e.g., "0"), respectively.

Next, the control unit 1212 updates the current control gate voltage $V_{LSB}'$ employed by the second read operation by V9 which is higher than V7 with 2 minimum step size ΔV (i.e. 2ΔV), and then controls the flash memory to perform the third read operation upon memory cells M_0-M_K according to the updated control gate voltage $V_{SB}''$. Thus, a third codeword CW_3' consisted of third bits of the bit sequences BS_0-BS_K is received by the receiving circuit 1220. Please note that the first codeword CW_1' originally buffered in the storage device 1222 will be overwritten by the second codeword CW_2'; additionally, bits of the second codeword CW_2' buffered in the storage device 1222 are transmitted to the comparing unit 1216 one by one before overwritten by the incoming bits of the third codeword CW_3'. The comparing unit 1216 is further arranged for comparing bits of the second codeword CW_2' (i.e., second bits of the bit sequences BS_0-BS_K) and bits of the third codeword CW_3' (i.e., third bits of the bit sequences BS_0-BS_K). The comparison result will indicate which bit position has the second bit flipping due to a transition from the second binary digit (e.g., "0") to the first binary digit (e.g., "1"). The counting unit 1214 is further arranged for counting the number of second bit flipping between the second codeword CW_2' and the third codeword CW_3'. That is, the counting unit 1214 generates a second counter number A2 by counting the number of second bit flipping between second bits and third bits of the bit sequences BS_0-BS_K, wherein one second bit flipping occurs when the second bit and the third bit of one bit sequence have the second binary digit (e.g., "0") and the first binary digit (e.g., "1"), respectively.

After receiving the first counter number A1 and the second counter number A2 generated from the counting unit 1214, the control unit 1212 determines the readout information which can pass the ECC parity check by referring to the first counter number A1 and the second counter number A2. For example, the control unit 1212 determines the shifting direction DS of the control gate voltage according to the first counter number A1 and the second counter number A2. More specifically, as can be seen from FIG. 5, the first counter number A1 represents the total number of 0's newly identified due to shifting the control gate voltage from V7 to V5, and the second counter number A2 represents the total number of 1's newly identified due to shifting the control gate voltage from V5 to V9. Thus, the number (A2−A1) is representative of a total number of 1's resulted from shifting the control gate voltage from V7 to V9. In this exemplary embodiment, (A2−A1) is greater than A1, implying that the local minimum of the threshold voltage distribution corresponding to logical "1" and "0" is located on a left side of the initial control gate voltage $V_{LSB}$. Based on such an observation, the control unit 1212 decides the shifting direction DS accordingly. In addition, the first counter number A1 represents the number of memory cells whose threshold voltages are located between V7 and V5. The number (A2−A1) represents the number of memory cells whose threshold voltages are located between V7 and V9. The first counter number A1 and number (A2−A1) represent the threshold voltage distribution of a part of the memory cells M_0-M_K of the physical page P_1. Please note that, the threshold voltage distribution obtained with the minimum step size ΔV (referring to FIG. 4) and the threshold voltage distribution obtained with twice the minimum step size 2ΔV (referring to FIG. 5) are different. The threshold voltage distribution obtained with 2ΔV (so called the second threshold voltage distribution) is smoother than the threshold voltage distribution obtained with ΔV (so called the first threshold voltage distribution). The first threshold voltage distribution represents threshold voltages of a first group of memory cells whose threshold voltages are located between V6 and V8. The second threshold voltage distribution represents threshold voltages of a second group of memory cells whose threshold voltages are located between V5 and V9. The first group of the memory cells comprises the second group of the memory cells.

The determination of step size used for control gate voltage adjustment can be referred to the program/erase count (P/E cycles) of the memory cells to be read. Generally speaking, memory cells having higher P/E cycles will suffer a worse non-uniform threshold voltage effect. The step size should be increased correspondingly for eliminating the effect. The control unit 1212 can find out a program/erase count of the target memory cells from a lookup table in the control logic 1210 and determine the step size of control gate voltage adjustment used in the threshold voltage tracking mechanism accordingly. Please note that the step size can be determined according to other characteristic of the target memory cells.

After the correct shifting direction DS obtained according to the second threshold voltage distribution is determined, the control logic 1212 determines a new control gate voltage according to the correct shifting direction DS. A correctable codeword can be found according to the correct shifting direction DS. The mechanism for obtaining the correctable codeword according to the correct shifting direction DS is similar to illustration mentioned above (please refer to FIG. 2 and FIG. 3 and related illustrations). Hence, further illustration is omitted.

Figure 7A:
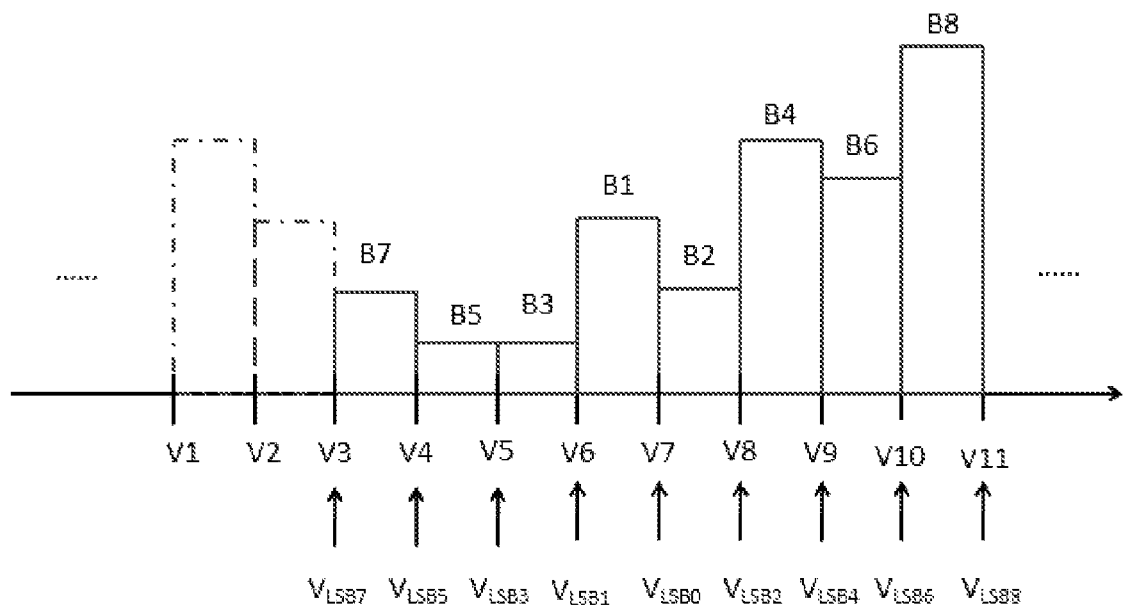
FIG. 7A is a diagram illustrating the adjustment made to the control gate voltage used for reading LSB data according to an embodiment of the present invention.

FIG. 7A is a diagram illustrating the adjustment made to the control gate voltage used for reading LSB data according to an embodiment of the present invention. Due to change of the threshold voltage distribution, the threshold voltages of some memory cells each originally programmed to store LSB=1 are distributed in the voltage region V5-V11, and the threshold voltages of some memory cells each originally programmed to store LSB=0 are distributed in the voltage region V1-V5. To have a minimum number of error bits presented in the readout information of the target physical page P_2, the control gate voltage for reading LSB data should be preferably set by V5 shown in FIG. 7A. When the initial control gate voltage $V_{LSB0}$ is set to V7 by the control unit 1212 and the flash memory 1100 performs the first read operation upon memory cells M_0-M_K of physical page P_2 according to the initial control gate voltage $V_{LSB0}$, the number of error bits presented in the readout information (i.e., a first codeword CW_1 consisted of first bits of the bit sequences BS_0-BS_K) exceeds the maximum number of error bits that can be corrected by the ECC circuit 1230. Thus, the threshold voltage tracking mechanism is enabled accordingly. Next, the control unit 1212 updates the initial control gate voltage $V_{LSB0}$ employed by the first read operation by V6 ($V_{LSB1}$) which is lower than V7 with a minimum step size (ΔV) that the memory controller 1200 can control the flash memory 1100 to adjust. Then the control unit 1212 controls the flash memory to perform the second read operation upon memory cells M_0-M_K of physical page P_2 according to the updated control gate voltage $V_{LSB1}$. Thus, a second codeword CW_2 consisted of second bits of the bit sequences BS_0-BS_K is received by the receiving circuit 1220. Please note that the first codeword CW_1 is buffered in the storage device 1222, and bits of the first codeword CW_1 buffered in the storage device 1222 are transmitted to the comparing unit 1216 one by one before overwritten by the incoming bits of the second codeword CW_2. The comparing unit 1216 is arranged for comparing bits of the first codeword CW_1 (i.e., first bits of the bit sequences BS_0-BS_K) and bits of the second codeword CW_2 (i.e., second bits of the bit sequences BS_0-BS_K). The comparison result will indicate which bit position has one first bit flipping due to a transition from a first binary digit (e.g., "1") to a second binary digit (e.g., "0"). The counting unit 1214 is coupled to the comparing unit 1216 and the control unit 1212, and is arranged for counting the number of first bit flipping between the first codeword CW_1 and the second codeword CW_2. That is, the counting unit 1214 generates a first counter number B1 by counting the number of first bit flipping between first bits and second bits of the bit sequences BS_0-BS_K, wherein one first bit flipping occurs when the first bit and the second bit of one bit sequence have the first binary digit (e.g., "1") and the second binary digit (e.g., "0"), respectively.

Next, the control unit 1212 updates the current control gate voltage $V_{LSB1}$ employed by the second read operation by V8 which is higher than V7, and then controls the flash memory to perform the third read operation upon memory cells M_0-M_K of physical page P_2 according to the updated control gate voltage $V_{LSB2}$. Thus, a third codeword CW_3 consisted of third bits of the bit sequences BS_0-BS_K of physical page P_2 is received by the receiving circuit 1220. Please note that the first codeword CW_1 originally buffered in the storage device 1222 will be overwritten by the second codeword CW_2; additionally, bits of the second codeword CW_2 buffered in the storage device 1222 are transmitted to the comparing unit 1216 one by one before overwritten by the incoming bits of the third codeword CW_3. The comparing unit 1216 is further arranged for comparing bits of the second codeword CW_2 (i.e., second bits of the bit sequences BS_0-BS_K) and bits of the third codeword CW_3 (i.e., third bits of the bit sequences BS_0-BS_K). The comparison result will indicate which bit position has the second bit flipping due to a transition from the second binary digit (e.g., "0") to the first binary digit (e.g., "1"). The counting unit 1214 is further arranged for counting the number of second bit flipping between the second codeword CW_2 and the third codeword CW_3. That is, the counting unit 1214 generates a second counter number B2 by counting the number of second bit flipping between second bits and third bits of the bit sequences BS_0-BS_K, wherein one second bit flipping occurs when the second bit and the third bit of one bit sequence have the second binary digit (e.g., "0") and the first binary digit (e.g., "1"), respectively.

As can be seen from FIG. 7A, the first counter number B1 represents the total number of 0's newly identified due to shifting the control gate voltage from V7 to V6, and the second counter number B2' represents the total number of 1's newly identified due to shifting the control gate voltage from V6 to V8. Thus, the number (B2'−B1) is representative of a total number of 1's resulted from shifting the control gate voltage from V7 to V8. The first counter number B1 maps to the control gate voltage region V7-V6 and represents the number of memory cells whose threshold voltages are located between the voltage region V7-V6. The number (B2'−B1), illustrated as B2 in FIG. 7A, maps to the control gate voltage region V7-V8 and represents the number of memory cells whose threshold voltages are located between the voltage region V7-V8. Under the teaching of the present embodiment, people skill in the art can readily understand how to adjust the control gate voltage from $V_{LSB3}$, $V_{LSB4}$, $V_{LSB5}$, $V_{LSB6}$, $V_{LSB7}$ to $V_{LSB8}$ and obtain the numbers (B3, B4, B5, B6, B7, and B8) mapping to each particular control gate voltage region by the control logic 1210. Hence, further illustrations are omitted. Please note that the set of number B1, B2, B3, B4, B5, B6, B7, and B8 and the corresponding mapping relations with the particular control gate voltage ranges can be deemed as a first threshold voltage distribution of the memory cells whose threshold voltages are located between V3 to V11 and can be stored in the control logic 1210. The number of adjusting the control gate voltages in the present embodiment is only an example rather than a limitation. People skill in the art can determine the number of adjusting the control gate voltages as required.

Figure 7B:
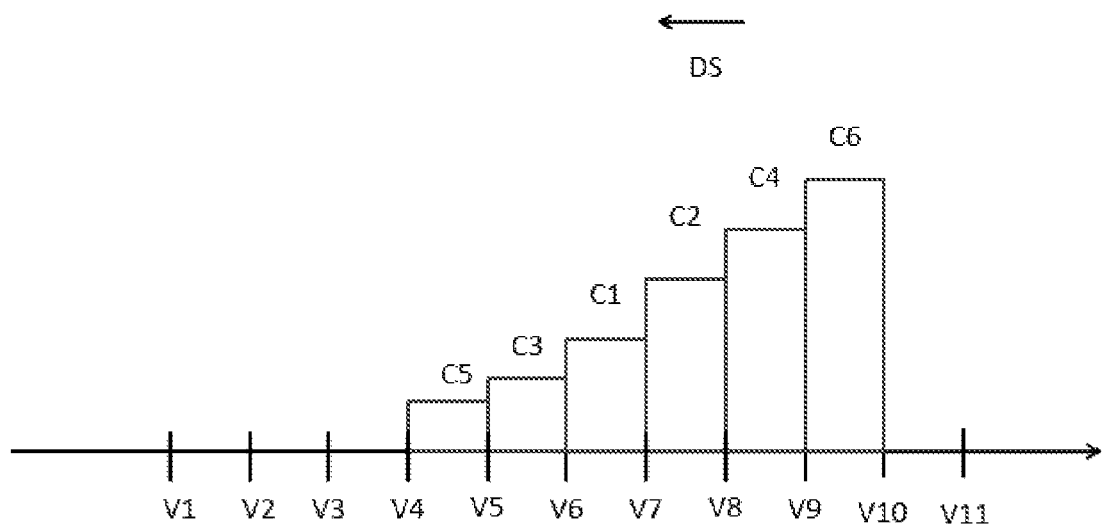
FIG. 7B is a diagram showing a threshold voltage distribution obtained from averaging the threshold voltage distribution shown in FIG. 7A.

Please refer to FIG. 7B in conjunction with FIG. 7A. FIG. 7B is a diagram showing a threshold voltage distribution obtained from averaging the threshold voltage distribution shown in FIG. 7A. Since the threshold voltage distribution shown in FIG. 7A (the first threshold voltage distribution) is not uniform, utilizing the first threshold voltage distribution to determining a control gate voltage for performing a read operation upon the physical page P_2 may not obtain a correctable codeword. Hence, the control logic performs an average operation upon the first threshold voltage distribution for eliminating the non-uniform effect and obtains a smoother threshold voltage distribution (a second threshold voltage distribution). Further details are described as follows.

As shown in FIG. 7B, the second threshold voltage distribution comprises a set of number C1, C2, C3, C4, C5, and C6. Each number maps to a particular control gate voltage region. The number C1 maps to the control gate voltage region V7-V6 and represents the number of memory cells whose threshold voltages are located between the voltage region V7-V6. Similarly, the number C2 maps to the control gate voltage region V7-V8 and represents the number of memory cells whose threshold voltages are located between the voltage region V7-V8, and so on. The control logic 1210 obtains the number C1 by averaging B1, B2, and B3. In the first threshold voltage distribution, the number B1 maps to voltage region V6-V7. The voltage region mapping relation of the number B1 is the same as the voltage region mapping relation of the number C1. The number B2 maps to voltage region V7-V8, i.e. a voltage range neighboring to voltage region of the number C1 (i.e. V6-V7). The number B3 maps to voltage region V5-V6, i.e. another voltage range neighboring to voltage region of the number C1 (i.e. V6-V7). The number C2, C3, C4, C5, and C6 can be obtained by the control logic 1210 in a similar way.

Please note that a smoother second threshold voltage distribution can be obtained from the first threshold voltage distribution in many ways different from the embodiment illustrated above. For example, the number C1 can be obtained by averaging the numbers B1-B5, B1-B2, or B1 and B3. Alternatively, the control logic 1210 can perform a running sum operation upon the numbers B1-B8 to obtain the numbers C1-C6. For example, the number C1 can be obtained by summing the numbers B1-B3. The number C2 can be obtained by summing the numbers B1, B2, and B4, and so on. Please note that the second threshold voltage distribution can be determined by performing an average operation or a running sum operation upon the first threshold voltage operation. In other words, the second threshold voltage distribution is obtained by processing the information (e.g. number of memory cells and mapping relations) of the first threshold voltage distribution.

Figure 7C:
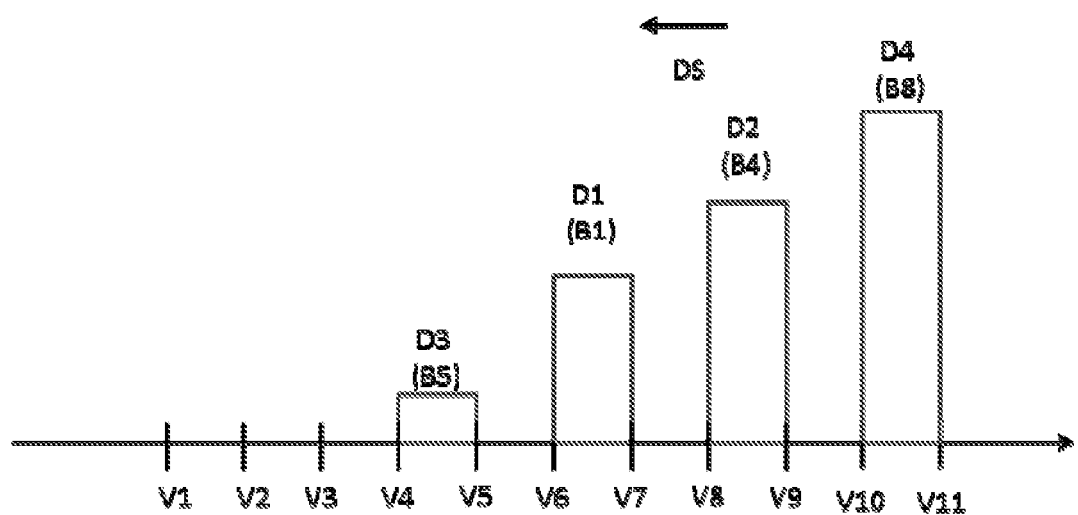
FIG. 7C is a diagram showing a threshold voltage distribution obtained from selecting a part of information of the threshold voltage distribution shown in FIG. 7A.

In addition, please refer to FIG. 7C in conjunction with FIG. 7A. FIG. 7C is a diagram showing a threshold voltage distribution obtained from selecting a part of information of the threshold voltage distribution shown in FIG. 7A. A smoother threshold voltage distribution can be obtained from selecting a part of information of the first threshold voltage distribution. As shown in FIG. 7C, a smoother second threshold voltage distribution comprises a set of number D1, D2, D3, and D4. Each number maps to a particular control gate voltage region. The number D1 maps to the control gate voltage region V7-V6 and represents the number of memory cells whose threshold voltages are located between the voltage region V7-V6. Similarly, the number D2 maps to the control gate voltage region V8-V9 and represents the number of memory cells whose threshold voltages are located between the voltage region V8-V9, and so on. The control logic 1210 obtains the number D1 and the mapping relation by selecting B1 as D1. The control logic 1210 obtains the number D2 and the mapping relation by selecting B4 as D2, and so on. The set of number B1, B4, B5, and B8 can be selected by a discontinuous voltage spacing from the first threshold voltage distribution.

For obtaining a further smoothing threshold voltage distribution, a step size for obtaining the first threshold voltage can be also adjusted. In other words, the control logic 1210 can adjust the step size for obtaining the first threshold voltage distribution according to the concept illustrated in FIG. 5 and related illustrations and smooth the first threshold voltage distribution for obtaining the second threshold voltage distribution according to the concept illustrated in the above embodiments.

As shown in FIG. 7B and FIG. 7C, the second threshold voltage distribution is smooth and uniform. The control logic 1210 can obtain a correct shifting direction DS from the second threshold voltage distribution. The concept of obtaining the correct shifting direction according to the threshold voltage distribution is similar to the above embodiments. Hence, further illustrations are omitted.

After the correct shifting direction DS obtained according to the second threshold voltage distribution is determined, the control logic 1212 determines a new control gate voltage for performing a read operation upon the physical page P_2 according to the correct shifting direction DS. A correctable codeword can be found according to the correct shifting direction DS. The mechanism for obtaining the correctable codeword according to the correct shifting direction DS is similar to illustration mentioned above (please refer to FIG. 2 and FIG. 3 and related illustrations). Hence, further illustration is omitted.

Alternatively, the control logic 1212 can determines a new control gate voltage for performing a read operation upon the physical page P_2 according to a minimum number of the second threshold voltage distribution. For example, the minimum number of the second threshold voltage distribution shown in FIG. 7B is C5. Hence, the control logic 1212 can determine a new control gate voltage for performing the read operation upon the physical page P_2 according to the voltage region that the number C5 mapped to. The number C5 maps to the voltage region V4-V5. The new control gate voltage can be determined as V4 or V5 or other voltages neighboring to voltage region V4-V5.

Figure 8:
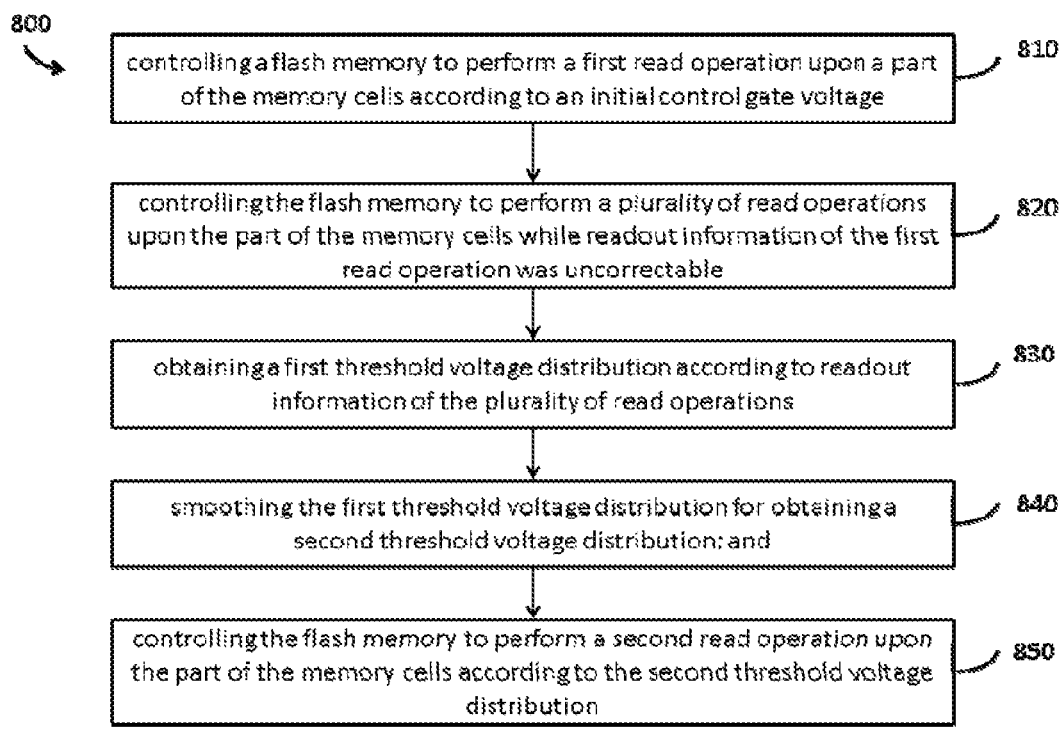
FIG. 8 is a flow chart illustrating a concept of the present invention.

FIG. 8 is a flow chart illustrating a concept of the present invention. The order of the steps in the following flow is an exemplary embodiment of the present invention rather than a limitation. The flow 800 comprises the flowing steps:

Step 810: controlling a flash memory to perform a first read operation upon a part of the memory cells according to an initial control gate voltage;

Step 820: controlling the flash memory to perform a plurality of read operations upon the part of the memory cells while readout information of the first read operation was uncorrectable;

Step 830: obtaining a first threshold voltage distribution according to readout information of the plurality of read operations;

Step 840: smoothing the first threshold voltage distribution for obtaining a second threshold voltage distribution; and Step 850: controlling the flash memory to perform a second read operation upon the part of the memory cells according to the second threshold voltage distribution.

In Step 810, the control logic 1210 controls the flash memory 1100 to perform a first read operation upon a part of the memory cells of flash memory 1100, e.g. physical page P_1, according to an initial control gate voltage, e.g. $V_{LSB0}$. While readout information of the first read operation was uncorrectable, in step 820, the control logic 1210 controls the flash memory 1100 to perform a plurality of read operations upon the physical page P_1. Since the readout information is uncorrectable, a better control gate voltage should be found for performing the read operation and obtaining correct (correctable) readout information. In step 830, the control logic 1210 obtains a first threshold voltage distribution according to readout information of the plurality of read operations. However, the first threshold voltage distribution may be non-uniform. Hence, in step 840, the first threshold voltage distribution should be processed by the control logic 1210 for obtaining a smoother second threshold voltage distribution. Since the second threshold voltage distribution is obtained, a shifting direction for adjusting the control gate voltage can be determined accordingly, or a better control gate voltage can be obtained according to a minimum value of the second threshold voltage distribution. In step 850, the control logic 1210 controls the flash memory 1100 to perform a second read operation upon the physical page P_1 according to the second threshold voltage distribution. Hence, correct (or correctable) readout information can be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading data stored in a flash memory, wherein the flash memory comprises a first set of memory cells and a second set of memory cells, and each memory cell corresponds to a particular threshold voltage, and the method comprises:

obtaining a first codeword and a second codeword by reading the first set of the memory cells;

obtaining a first voltage characteristic of the first set of the memory cells according to the first codeword and the second codeword;

obtaining a third codeword by reading the second set of the memory cells;

obtaining a second voltage characteristic of the second set of the memory cells according to the first codeword, the second codeword and the third codeword; and reading the first set of the flash memory by using the second voltage characteristic;

wherein the first set of memory cells comprises at least a part of the second set of the memory cells.

2. The method as claimed in claim 1, wherein the first voltage characteristic is different from the second voltage characteristic.

3. The method as claimed in claim 1, wherein the step of reading the first set of the flash memory by using the second voltage characteristic further comprises:

determining a shifting direction according to the first codeword, the second codeword and the third codeword; and adjusting a control gate voltage for performing the read operation according to the shifting direction.

4. A memory controller for reading data stored in a flash memory, wherein the flash memory comprises a first set of memory cells and a second set of memory cells, and each memory cell corresponds to a particular threshold voltage, and the memory controller comprises:

a control logic, obtaining a first voltage characteristic of the first set of the memory cells according to a first codeword and a second codeword, obtaining a second voltage characteristic of the second set of the memory cells according to the first codeword, the second codeword and a third codeword, and reading the first set of the flash memory by using the second voltage characteristic;

wherein the first set of memory cells comprises at least a part of the second set of the memory cells.

5. The memory controller as claimed in claim 4, wherein the first voltage characteristic is different from the second voltage characteristic.

6. The memory controller as claimed in claim 4, wherein the step of reading the first set of the flash memory by using the second voltage characteristic further comprises:

determining a shifting direction according to the first codeword, the second codeword and the third codeword; and adjusting a control gate voltage for performing the read operation according to the shifting direction.

7. A method for reading data stored in a flash memory, wherein the flash memory comprises a plurality of memory cells and each memory cell has a particular threshold voltage, the method comprising:

reading a part of the memory cells of the flash memory by a first control gate voltage;

detecting error bits of the memory cells;

correcting the error bits of the memory cell by reading the flash memory continuously;

obtaining a first codeword and a second codeword by reading the first set of the memory cells;

obtaining a first voltage characteristic of the first set of the memory cells according to the first codeword and the second codeword;

averaging the first voltage characteristic for obtaining a second voltage characteristic; and reading a part of the flash memory again by using the second voltage characteristic;

wherein a first set of memory cells comprises at least a part of a second set of the memory cells.

8. A system for reading data stored in a flash memory, wherein the flash memory comprises a plurality of memory cells and each memory cell has a particular threshold voltage, the system comprising:

a control logic for reading a part of the memory cells of the flash memory by using a first control gate voltage;

a detector for detecting error bits of the memory cells;

a corrector for correcting the error bits of the memory cell by reading the flash memory continuously;

wherein the control logic further obtains a first codeword and a second codeword by reading the first set of the memory cells, obtains a first voltage characteristic of the first set of the memory cells according to the first codeword and the second codeword, averages the first voltage characteristic for obtaining a second voltage characteristic, and reads a part of the flash memory again by using the second voltage characteristic; and wherein a first set of memory cells comprises at least a part of a second set of the memory cells.

* * * * *